United States Patent [19]

Toko

[11] Patent Number: 4,932,072
[45] Date of Patent: Jun. 5, 1990

[54] MOBILE STATION EQUIPMENT FOR A MOBILE RADIO TELEPHONE SYSTEM

[75] Inventor: Yoshio Toko, Hyogo, Japan

[73] Assignee: Mitsubishi Denki Kabushiki Kaisha, Tokyo, Japan

[21] Appl. No.: 196,259

[22] Filed: May 20, 1988

[30] Foreign Application Priority Data

May 22, 1987 [JP] Japan .................. 62-125283

[51] Int. Cl.$^5$ ..................... H04B 11/16; H04B 1/26
[52] U.S. Cl. .................................. 455/76; 455/183; 455/264; 455/316
[58] Field of Search ............ 455/76, 78, 314, 315, 455/183, 316, 260, 264, 255, 256, 208, 209, 164, 165, 185, 186, 182, 258, 259; 331/2, 22, 25, 31

[56] References Cited

U.S. PATENT DOCUMENTS

| 4,476,575 | 10/1984 | Franke et al. | 455/78 |
| 4,520,474 | 5/1985 | vilmur | 455/76 |
| 4,521,916 | 6/1985 | Wine | 455/183 |
| 4,619,002 | 10/1986 | Thro | 455/226 |
| 4,727,591 | 2/1988 | Manlove | 455/183 |

FOREIGN PATENT DOCUMENTS 57-129519 8/1982 Japan .

OTHER PUBLICATIONS

Stuart J. Lipoff, *'Logical' Design Relaxes Tough Crystal Standards*, Aug. 1977, vol. 16, No. 8, pp. 52–60.

Primary Examiner—Reinhard J. Eisenzopf
Assistant Examiner—Curtis A. Kuntz
Attorney, Agent, or Firm—Bernard, Rothwell & Brown

[57] ABSTRACT

A mobile station equipment for a mobile radio telephone system uses a voltage-controlled, temperature-compensated crystal oscillator (VC-TCXO) as a reference oscillator for local oscillators in frequency converters which convert an RF signal into IF signals. The oscillation frequency of the VC-TCXO is controlled by counting the second IF information and evaluating its difference from a certain reference value. At reception, the local oscillators have their reference frequency stabilized based on the stable frequency information from the base station. The equipment is compact and has reduced power dissipation and lower manufacturing cost.

10 Claims, 4 Drawing Sheets

MOBILE STATION EQUIPMENT FOR A MOBILE RADIO TELEPHONE SYSTEM

BACKGROUND OF THE INVENTION

1. Field of the Invention

The present invention relates to a mobile station equipment used for a radio telephone system installed on vehicles such as automobiles or a radio telephone system including portable radio telephone facilities.

2. Description of the Prior Art

FIG. 1 shows in block diagram the mobile station equipment used for the conventional mobile radio telephone system (e.g., car telephone system). In the figure, indicated by 1 is an antenna, 2 is a transmitter-receiver equipped detachably to the antenna 1, 3 is an RF amplifier connected to the transmitter-receiver 2, 4 is a 1st mixer which is in connection with a frequency synthesizer 13 serving as a 1st local oscillator and constitutes a 1st frequency converting means for converting a radio frequency (RF) reception signal from the RF amplifier 3 into a 1st intermediate frequency (IF) signal, 5 is a band-pass filter connected to the 1st mixer 4, 6 is a second mixer connected to the band-pass filter 5 and constituting a second frequency converting means, 7 is a 2nd local oscillator, e.g., a crystal oscillator, which supplies a local oscillation frequency signal to the 2nd mixer 6 so that it converts the 1st IF signal to a 2nd IF signal, 8 is an IF amplifier connected to the 2nd mixer 6, 9 is a demodulator connected to the IF amplifier 8, 10 is a field strength detector connected to the IF amplifier 8, 11 is a main controller connected to the demodulator 9 and field strength detector 10 and having an audio signal processing function, 16 is a temperature-compensated crystal oscillator (will be termed "TCXO") used for reference frequency generation connected to frequency synthesizer, 12 is a frequency synthesizer connected to the main controller 11 and TCXO 16 and incorporating a sending modulator, 14 is a sending mixer connected to the frequency synthesizer 12 for modulation and frequency synthesizer 13 as a 1st local oscillator, and 15 is a power amplifier connected to the sending mixer 14 and transmitter-receiver 2.

Next, the operation of the above arrangement will be described. The modulating frequency synthesizer 12, with its reference frequency being derived from the TCXO 16, oscillates at a fixed frequency and provides its oscillation output to the sending mixer 14. The frequency synthesizer 13, having a reference frequency provided by the TCXO 16 and serving as a 1st local oscillator, is controlled by a channel setting signal from the main controller 11 and delivers the 1st local oscillation frequency corresponding to the channel to the 1st mixer 4 and sending mixer 14. Accordingly, the frequency synthesizer 12 has its oscillation frequency fixed to the difference between the 1st local oscillation frequency and corresponding transmission frequency, resulting in the equality of the output frequency of the sending mixer 14 to the transmission frequency, and the output of the sending mixer 14 is amplified by the power amplifier 15, processed by the transmitter-receiver 2, and radiated by the antenna 1.

A received radio wave is introduced by way of the antenna 1, transmitter-receiver 2 and RF amplifier 3, and mixed with the output of the frequency synthesizer 13 by the 1st mixer 4 and, after removal of the RF component by the band-pass filter 5, further mixed with the output of the 2nd local oscillator 7 by the 2nd mixer 6. The mixed signal is processed by the IF amplifier 8, and the signal is extracted by the demodulator 9 and then processed by the audio processing function of the main controller 11. A part of the signal at the output of the IF amplifier 8 is also delivered to the field strength detector 10, which provides a voltage representative of the received electric field strength to the main controller 11.

The conventional mobile station equipment for the mobile radio telephone system is arranged as described above, and therefore the frequency stability for reception is dependent on the stability of the TCXO 16 and 2nd local oscillator 7, especially TCXO 16, resulting in a temperature-dependent variation and aging-dependent variation not smaller than around ±2 ppm in general. Using, for example a TCXO with a provision of a temperature regulated chamber, with the intention of suppressing the variation as low as ±1 ppm, results in an increased cost, bulkiness, start-up time, and power dissipation, and such equipment will be unsuitable for the mobile station of a land mobile telephone system.

SUMMARY OF THE INVENTION

The present invention is intended to overcome the foregoing prior art deficiency, and its prime object is to provide a mobile station used for a mobile radio telephone system, in which the TCXO which provides a reference frequency to the local oscillator such as the frequency synthesizer is designed to produce a much stabilized output frequency.

Another object of this invention is to provide a mobile station for a mobile radio telephone system, which is designed to work at a much stabilized frequency, while at the same time being reduced in its bulkiness, power dissipation and manufacturing cost.

In order to achieve the above objectives, the inventive mobile station for a mobile radio telephone system employs a voltage-controlled, temperature-compensated crystal oscillator (will be termed "VC-TCXO") as a reference oscillator for the local oscillators such as the frequency synthesizer, with an associated count means for counting the 2nd IF information and a computing control means which calculates the difference between the count value of the count means and a certain reference value and provides a frequency fine adjustment control signal based on the calculated difference to the VC-TCXO.

In the mobile station equipment for the mobile radio telephone system, the 2nd IF information is counted by the count means, the difference between the count value and a certain reference value is evaluated by the computing control means, which provides the oscillation frequency fine adjustment control signal based on the difference to the VC-TCXO, and consequently in reception mode, the reference frequency to the local oscillators is stabilized on the basis of the accurate frequency information from the base station.

Other objects and advantages of the present invention will become more apparent from the following detailed description taken in conjunction with the accompanying drawings.

DETAILED DESCRIPTION OF THE PREFERRED EMBODIMENTS

Figure 1:
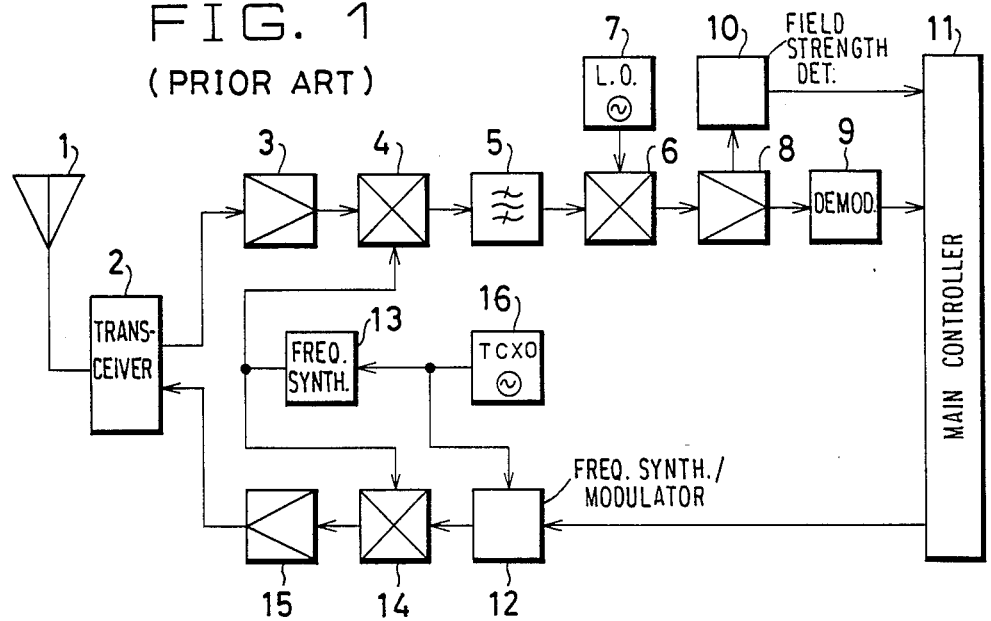
FIG. 1 is a schematic block diagram showing the conventional mobile station equipment for a mobile radio telephone system.
Figure 2:
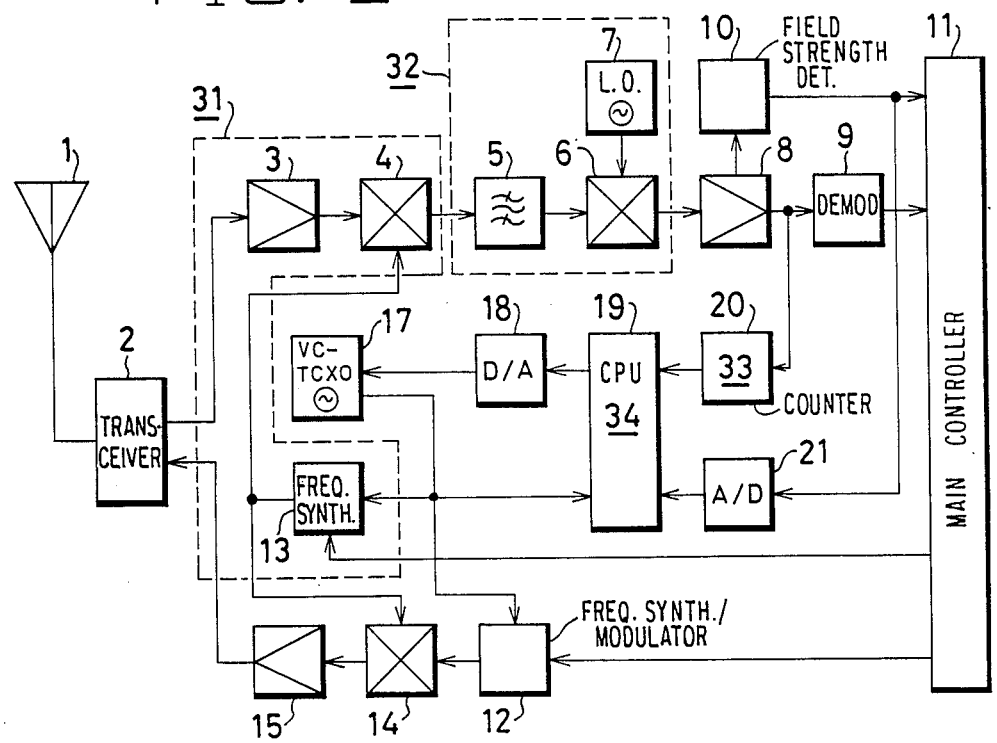
FIG. 2 is a schematic block diagram showing the mobile station equipment for a mobile radio telephone system according to the first embodiment of this invention.

Specific embodiments of the present invention will now be described with reference to the drawings. FIG. 2 shows in block diagram the mobile station of a mobile radio telephone system, e.g., car telephone system. Functional blocks identical to those of FIG. 1 are given the same symbols, and their detailed explanation will not be repeated.

In FIG. 2, indicated by 1 is an antenna, 2 is a transmitter-receiver in connection with the antenna 1, 3 is an RF amplifier, 4 is a 1st mixer constituting a 1st frequency converting means 31 for converting an RF reception signal from the RF amplifier 3 into a 1st IF signal based on the 1st local oscillation frequency provided by a frequency synthesizer 13, 5 is a band-pass filter, 6 is a 2nd mixer constituting a 2nd frequency converting means 32 for converting the output of the band-pass filter 5 into a 2nd IF signal, 7 is a 2nd local oscillator based on crystal for providing a 2nd local oscillation frequency to the 2nd mixer 6, 8 is an IF amplifier, 9 is a demodulator, 10 is a field strength detector, 11 is a main controller including an audio signal processing function, 12 is a frequency synthesizer for modulation, 13 is a frequency synthesizer functioning as a 1st local oscillator, 14 is a sending mixer, and 15 is a power amplifier.

Indicated by 17 is a voltage-controlled, temperature-compensated crystal oscillator (VC-TCXO), used in place of the conventional TCXO 16 shown in FIG. 1, for producing a reference frequency as a reference oscillator for the frequency synthesizers 12 and 13, and as a clock frequency for a subsidiary controller 19 described below, with its oscillation frequency being finely adjustable, 20 is a frequency counter as a count means 33 for counting the output frequency of the IF amplifier 8, 21 is an analog-to-digital converter (will be termed "A/D converter") for digitalizing the output voltage of the field strength detector 10, 19 is a subsidiary controller, e.g., a microprocessor, serving as a computing control means 34 which produces an oscillation frequency adjustment control signal for stabilizing the frequency of the VC-TCXO based on the information from the frequency counter 20 and A/D converter 21, and 18 is a digital-to-analog converter (will be termed "D/A converter") for producing a control voltage to the VC-TCXO 17 by evaluating in analog the oscillation frequency adjustment signal from the subsidiary controller 19.

Next, the operation of the above circuit arrangement will be described. At the start-up of the mobile station equipment, the subsidiary controller 19 controls the D/A converter 18 so that the control voltage to the VC-TCXO 17 has a center value. It is assumed that the frequency synthesizer 13, as the 1st local oscillator provided with a reference frequency by the VC-TCXO 17, has an output frequency deviation of $\Delta F_1$ as a result of the start-up control. An incoming radio wave (no frequency deviation is assumed here) from the base station (not shown) of the mobile radio telephone system is fed through the antenna 1, transmitter-receiver 2, and RF amplifier 3, and mixed with the output of the frequency synthesizer 13 by the 1st mixer 4. Subsequently, the mixed signal is fed through the band-pass filter 5 and further mixed with the output of the 2nd local oscillator 7 by the 2nd mixer 6, and amplified by the IF amplifier 8. The IF deviation at this time point is equal to the sum of deviations of the frequency synthesizer as the 1st local oscillator and the 2nd local oscillator 7. Since the 1st local oscillation frequency is generally 10 to 30 times the 2nd local oscillation frequency, when the deviation of the 2nd local oscillator 7 is neglected, the IF deviation becomes $\Delta F_1$.

The frequency counter 20 counts the number of on-/off transitions of output pulses from the IF amplifier 8 by being gated for the count period between 1's level or 0's level of the gate pulse produced by down-counting the oscillation frequency of the VC-TCXO 17. Assuming now the IF to be 455 kHz and the gate period to be 20 ms, the number of counts of IF in one gate period becomes 9100 and the resolution is 50 Hz. Assuming the temperature-dependent frequency deviation of the VC-TCXO 17 to be $\pm 2$ ppm, the count error due to the inaccurate gate period is $\pm 0.0182$ and thus the temperature-dependent frequency count deviation becomes $\pm 0.91$ Hz. For the operation in the 900 MHz band, for example, resolution and temperature-dependent deviations are both below 0.1 ppm, which is said to be sufficiently accurate.

Next, the matter of controlling the frequency synthesizer 13 as the 1st local oscillator will be described. Assuming the D/A converter 18 to have a resolution of 8 bits, the VC-TCXO 17 to have a frequency control sensitivity of 2 ppm/volt, and the control voltage to range 0 to 5 volts, the frequency control range becomes $\pm 5$ ppm and the frequency control resolution becomes about 0.02 ppm/bit. Accordingly, for the frequency synthesizer 13 having a frequency of 1 GHz, for example, the output frequency can be controlled in 20 Hz step over a range of $\pm 5$ kHz.

Figure 3:
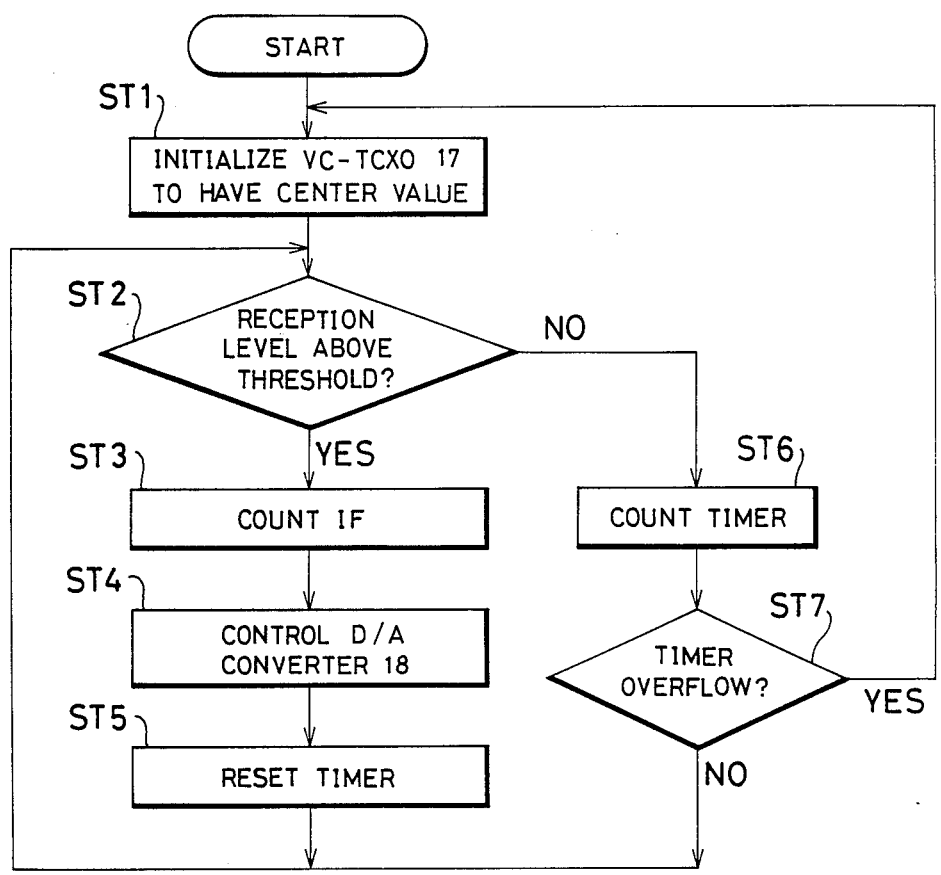
FIG. 3 is a flowchart showing the operation of the circuit arrangement shown in FIG. 2.

Next, the process of aforementioned frequency stabilization will be described in more detail with reference to the flowchart of FIG. 3. Initially, at start-up, the D/A converter 18 is controlled so that the control voltage to the VC-TCXO 17 has a center value (step ST1). In case of receiving a radio wave from the base station, the frequency deviation of the frequency synthesizer 13 as the 1st local oscillator appears directly as an IF deviation, provided that the frequency deviations of the base station and the 2nd local oscillator 7 are neglected as mentioned previously. The IF is counted by the frequency counter 20 (step ST3) and its difference from a certain reference value is evaluated by the subsidiary controller 19 thereby to determine the frequency deviation of VC-TCXO 17 at this time point. A control signal corresponding to a control voltage to the VC-TCXO 17 for nullifying the deviation is fed to the D/A converter 18 (step ST4). The above operation takes place each time the subsidiary controller 19 has detected in step ST2 through the converter 21 that the receiving field level is at or above the prescribed level. If, on the other hand, the receiving field level is below the prescribed level, the subsidiary controller 19 halts the control over D/A converter 18 and retains the previous state until the timer overflows (steps ST6, ST7). If the level stays below the prescribed level, the system is brought back to the state of start-up (step ST7), thereby preventing erroneous IF counting due to noises attributable to the lower receiving field level.

Figure 4:
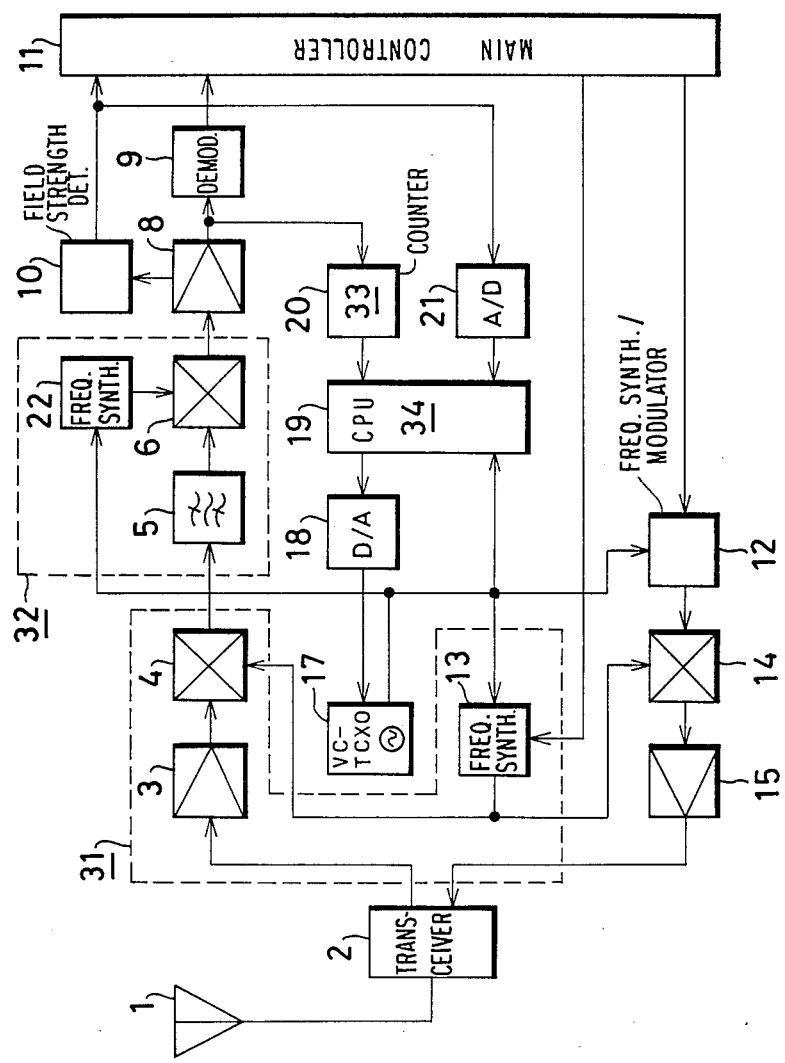
FIG. 4 is a schematic block diagram showing the mobile station equipment for a mobile radio telephone system according to another embodiment of this invention.

Although in the foregoing embodiment, a discrete crystal oscillator is used for the 2nd local oscillator 7, a frequency-divided signal based on the output of the VC-TCXO 17, for example, may be substituted therefor or alternatively the discrete crystal oscillator may be replaced with another frequency synthesizer 22 having a reference frequency derived from the output of the VC-TCXO 17, as shown in FIG. 4. These additional embodiments stabilize the frequency deviation of the 2nd local oscillator through a process similar to the previous embodiment, and the mobile station equipment has its frequency deviation made completely equal to the deviation of incoming radio wave from the base station, whereby the frequency can be more stabilized than in the previous embodiment.

Although in the above embodiment, the output of the field strength detector 10 is converted by the A/D converter 21, then the subsidiary controller 19 judges the strength of received electric fields on the basis of the outputs of the A/D converter 21, it will be possible to offer another embodiment by exchanging the A/D converter 21 for a comparator.

Figure 5:
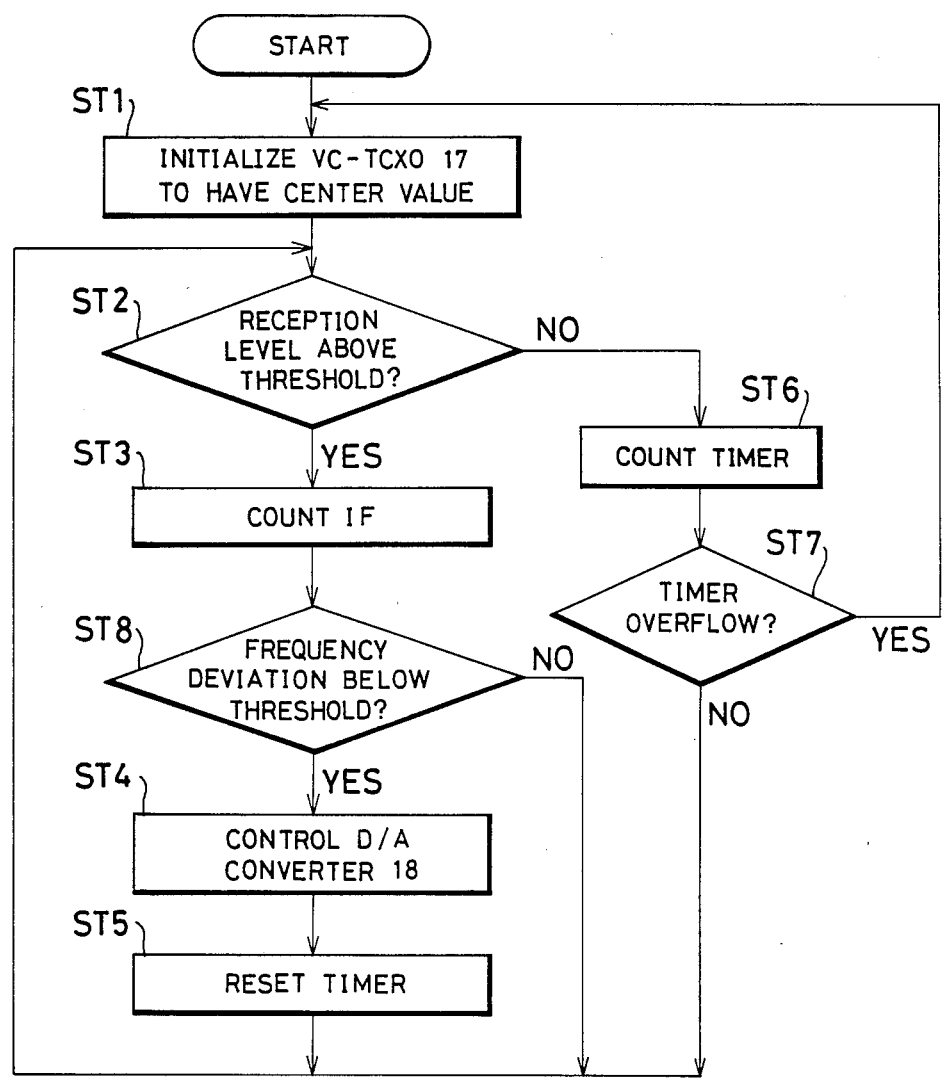
FIG. 5 is a flowchart showing the operation of the mobile station equipment for a mobile radio telephone system according to a further embodiment of this invention.

Furthermore, while in the above embodiment, the subsidiary controller 19 controls the D/A converter 18 uninterruptedly when the reception level is above the prescribed level, it may be desirable as shown in FIG. 5, to insert a step ST8 between the steps of step ST3 and ST4, and an alternative control algorithm is to quit the control for the D/A converter 18 when the deviation of the 2nd IF count value from the reference value is greater than a prescribed value, and this embodiment can prevent malfunctioning caused by spurious emission within the same channel, whereby the frequency stabilization is further ensured.

Although the foregoing embodiments are the application of this invention to a land mobile telephone system, an application system can of course be a portable telephone system.

According to the present invention, as described above, the VC-TCXO which provides a reference frequency for the frequency synthesizer comprising the local oscillators has its output frequency stabilized based on the stable frequency information coming from the base station, eliminating the need of having a temperature-stabilized high-stability reference frequency oscillation source for the self station, whereby the frequency stabilization can be accomplished while reducing the bulkiness, power dissipation and manufacturing cost of the equipment. reducing the bulkiness, power dissipation and manufacturing cost of the equipment.

What is claimed is:

1. A mobile station equipment for a mobile radio telephone system comprising:
   first frequency converting means, which includes a first local oscillator and a first mixer, for converting a radio frequency (RF) reception signal into a first intermediate frequency (IF) signal based on the output of said first local oscillator;
   second frequency converting means, which includes a second local oscillator and a second mixer, for converting the first IF signal from said first frequency converting means into a second IF signal based on the output of said second local oscillator;
   a voltage-controlled, temperature-compensated crystal oscillator for providing a reference frequency to at least said first local oscillator;
   counting means for counting the second IF signal;
   means for providing a reference value; and
   computational control means which evaluates the difference of a count value of said counting means from said reference value, and provides a control signal for controlling said voltage-controlled crystal oscillator based on the evaluated difference, to said voltage-controlled crystal oscillator.

2. A mobile station equipment according to claim 1, wherein said computational control means comprises means which implements control over said voltage-controlled, temperature-compensated crystal oscillator uninterruptedly when the received electric field of said reception signal is above a prescribed level.

3. A mobile station equipment according to claim 1, wherein said computational control means comprises means which implements control over said voltage-controlled, temperature-compensated crystal oscillator when the received electric field of said reception signal is above a prescribed level and at the same time when a deviation of the second IF signal is below a prescribed level.

4. A mobile station equipment according to claim 2, wherein said computational control means comprises means which judges as to whether said received electric field is above a prescribed level on the basis of the electric field strength of the second IF signal detected by an electric field strength detector.

5. A mobile station equipment according to claim 4, wherein said computational control means comprises means which includes an A/D converter for providing analog-to-digital conversion for the detected output of said electric field strength detector.

6. A mobile station equipment according to claim 4, wherein said computational control means comprises means which includes a comparator for comparing the detected output of said electric field strength detector with a prescribed value.

7. A mobile station equipment according to claim 1, wherein said first local oscillator in said first frequency converting means comprises a frequency synthesizer which is supplied with a reference frequency from said voltage-controlled, temperature-compensated crystal oscillator.

8. A mobile station equipment according to claim 1, wherein said second local oscillator in said second frequency converting means comprises a crystal oscillator.

9. A mobile station equipment according to claim 1, wherein said second local oscillator in said second frequency converting means comprises an oscillator which uses a frequency-divided signal based on the signal derived from the output of said voltage-controlled, temperature-compensated crystal oscillator.

10. A mobile station equipment according to claim 1, wherein said second local oscillator in said second frequency converting means comprises a frequency synthesizer which is supplied with a reference frequency of said voltage-controlled, temperature-compensated crystal oscillator. of said voltage-controlled, temperature-compensated crystal oscillator.

* * * * *

UNITED STATES PATENT AND TRADEMARK OFFICE
CERTIFICATE OF CORRECTION

PATENT NO. : 4,932,072

DATED : June 5, 1990

INVENTOR(S) : Yoshio Toko

It is certified that error appears in the above-identified patent and that said Letters Patent is hereby corrected as shown below:

Column 1, line 37, after the word "synthesizer" insert the numeral --13--.

Column 5, lines 56 and 57, delete "reducing the bulkiness, power dissipation and manufacturing cost of the equipment."

Column 6, lines 65 and 66, delete "of said voltage-controlled, temperature-compensated crystal oscillator.

Signed and Sealed this

Twenty-second Day of October, 1991

Attest:

HARRY F. MANBECK, JR.

*Attesting Officer*　　　　　　*Commissioner of Patents and Trademarks*

UNITED STATES PATENT AND TRADEMARK OFFICE
CERTIFICATE OF CORRECTION

PATENT NO. : 4,932,072

DATED : June 5, 1990

INVENTOR(S) : Yoshio Toko

It is certified that error appears in the above-identified patent and that said Letters Patent is hereby corrected as shown below:

Column 1, line 37, after the word "synthesizer" insert the numeral --13--.

Column 5, lines 56 and 57, delete "reducing the bulkiness, power dissipation and manufacturing cost of the equipment."

Column 6, lines 65 and 66, delete "of said voltage-controlled, temperature-compensated crystal oscillator."

This certificate supersedes Certificate of Correction issued October 22, 1991.

Signed and Sealed this

Twenty-sixth Day of November, 1991

*Attest:*

HARRY F. MANBECK, JR.

*Attesting Officer*     *Commissioner of Patents and Trademarks*